US012680842B2

(12) United States Patent　　(10) Patent No.:　US 12,680,842 B2

Cruchon et al.　　(45) Date of Patent:　Jul. 14, 2026

(54) SELF-CONTAINED PHYSICAL DATA SENSOR OPERATING BY THE ENERGY INPUT FROM A PHOTOVOLTAIC MODULE

(71) Applicant: DRACULA TECHNOLOGIES, Valence (FR)

(72) Inventors: Brice Cruchon, Guilherand Granges (FR); Sadok Ben Dkhil, Valence (FR); Enora Arche, Valence (FR)

(73) Assignee: DRACULA TECHNOLOGIES, Valence (FR)

( * ) Notice: Subject to any disclaimer, the term of this patent is extended or adjusted under 35 U.S.C. 154(b) by 306 days.

(21) Appl. No.: 18/260,920

(22) PCT Filed: Feb. 11, 2022

(86) PCT No.: PCT/FR2022/050250

§ 371 (c)(1),
(2) Date: Jul. 10, 2023

(87) PCT Pub. No.: WO2022/171964

PCT Pub. Date: Aug. 18, 2022

(65) Prior Publication Data

US 2024/0060827 A1　　Feb. 22, 2024

(30) Foreign Application Priority Data

Feb. 11, 2021　(FR) ........................................ 2101316
Jun. 17, 2021　(FR) ....................................... 2106419

(51) Int. Cl.
*G01D 11/24*　　(2006.01)
*G01K 3/10*　　(2006.01)
(Continued)

(52) U.S. Cl.
CPC ........... *G01D 11/245* (2013.01); *H10K 30/50* (2023.02); *H10K 30/80* (2023.02); *H10K 30/81* (2023.02); *G01K 3/10* (2013.01); *H10K 39/00* (2023.02)

(58) Field of Classification Search
CPC ...... G01D 11/245; H10F 19/80; H10K 30/50; H10K 30/80; H10K 30/81
See application file for complete search history.

(56) References Cited

U.S. PATENT DOCUMENTS

2017/0205533 A1*　7/2017　Li ....................... G01V 11/002
2019/0103570 A1　4/2019　Hammond et al.

FOREIGN PATENT DOCUMENTS

DE　　102011118902 A1　　6/2012
DE　　102017122879 A1　　4/2019
(Continued)

OTHER PUBLICATIONS

English machine translation of KR 20180001827A. (Year: 2018).*
(Continued)

*Primary Examiner* — Lindsey A Buck
(74) *Attorney, Agent, or Firm* — Conley Rose, P.C.

(57) ABSTRACT

The invention relates to a physical data sensor comprising: a photovoltaic module having at least two photovoltaic cells that are interconnected in series, an electronic device configured to collect and transmit at least temperature data, the electronic device comprising a flexible printed circuit, electrical connector means connecting the photovoltaic module and the electronic device.

9 Claims, 3 Drawing Sheets

(51) Int. Cl.
| | | |
|---|---|---|
| *H10K 30/50* | (2023.01) | |
| *H10K 30/80* | (2023.01) | |
| *H10K 30/81* | (2023.01) | |
| *H10K 39/00* | (2026.01) | |

(56) References Cited

FOREIGN PATENT DOCUMENTS

| | | | | | |
|---|---|---|---|---|---|
| FR | 3083372 | A1 | | 1/2020 | |
| JP | H04106884 | A | | 4/1992 | |
| JP | 2013513958 | A | | 4/2013 | |
| JP | 2016184697 | A | | 10/2016 | |
| JP | 2019534576 | A | | 11/2019 | |
| JP | 2021012132 | A | | 2/2021 | |
| KR | 20180001827 | A | * | 1/2018 | ......... H01L 31/0543 |
| WO | WO-2020002857 | A1 | * | 1/2020 | ............ H10K 30/30 |
| WO | 2022171964 | A1 | | 8/2022 | |

OTHER PUBLICATIONS

English machine translation of WO 2020002857A1. (Year: 2020).*
Foreign Communication from a Related Counterpart Application, International Search Report and Written Opinion dated May 11, 2022, International Application No. PCT/FR2022/050250 filed on Feb. 11, 2022.
Ostfeld, et al., "Flexible photovoltaic power systems: integration opportunities. challenges and advances" Flexible and Printed Electronics, vol. 2, No. 1, Mar. 2017 (Mar. 2017), 25 pages, DOI: 10.1088/2058-8585/aa5750, XP055525316.
Foreign Communication from a Related Counterpart Application, Japanese Notice of Refusal dated Nov. 25, 2025, Japanese Application No. 2023547893 filed on Aug. 8, 2023.

* cited by examiner

[Fig 1]
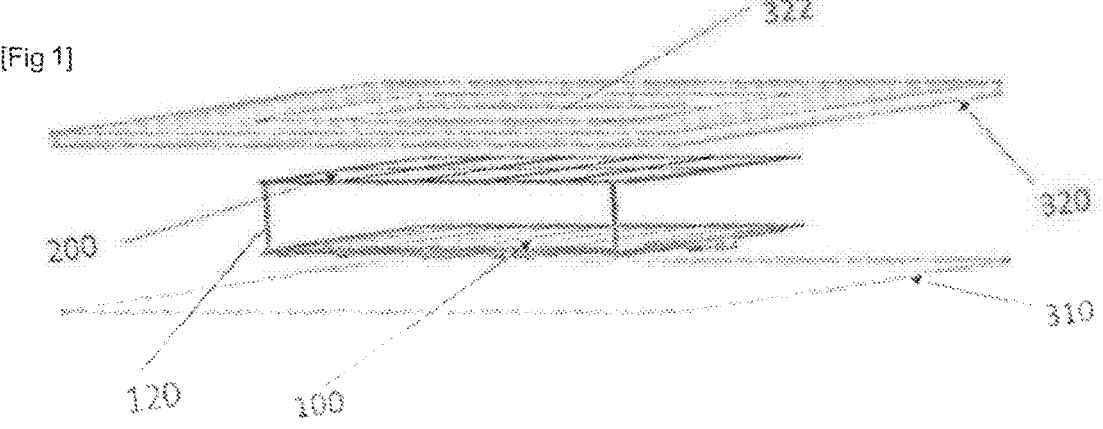
[Fig 2]
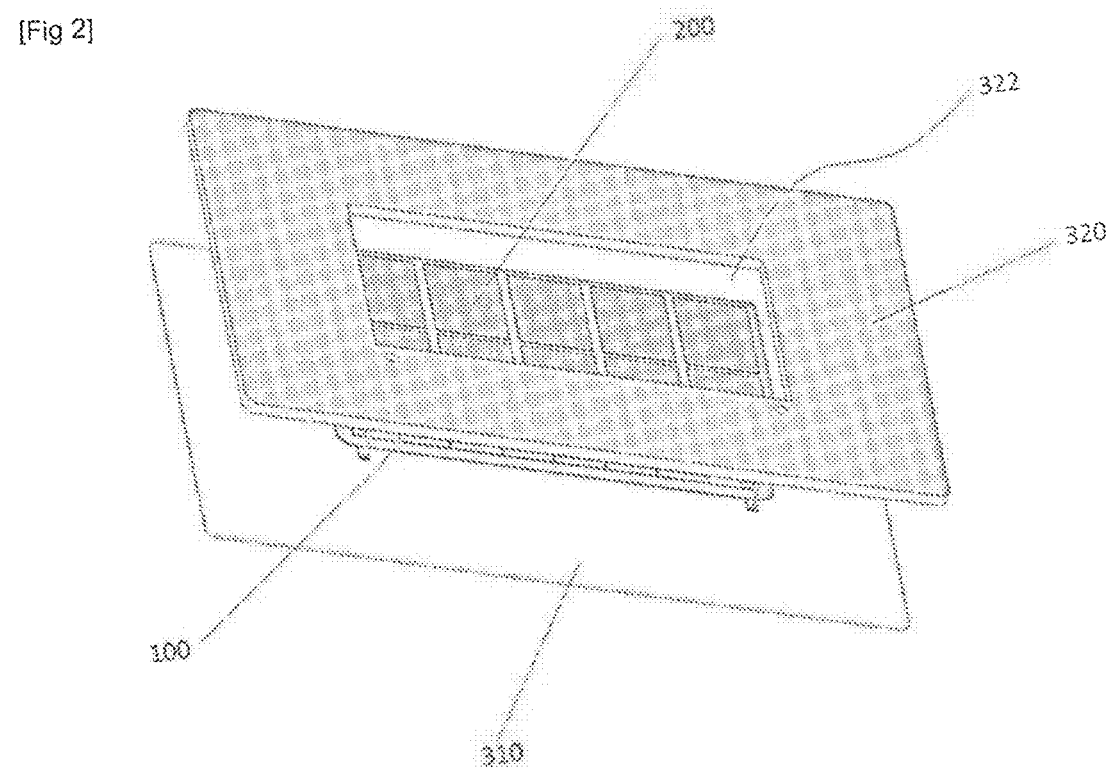

[Fig 3]
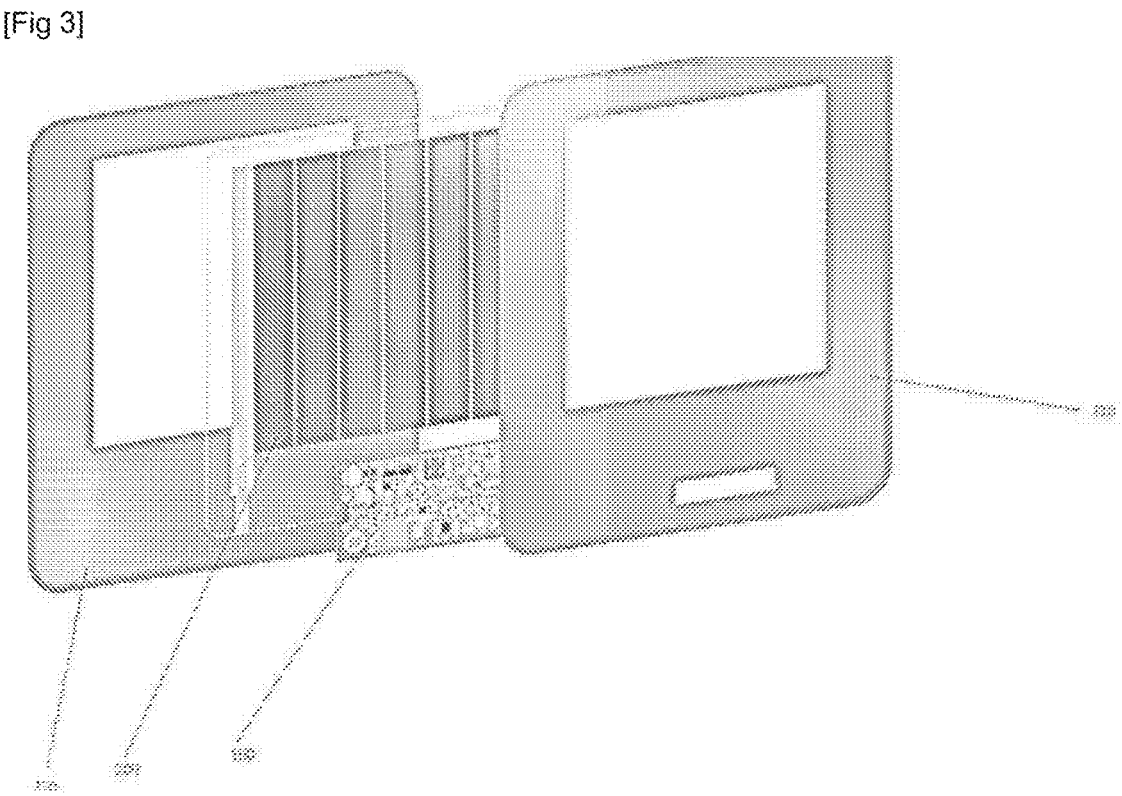
[Fig 4]
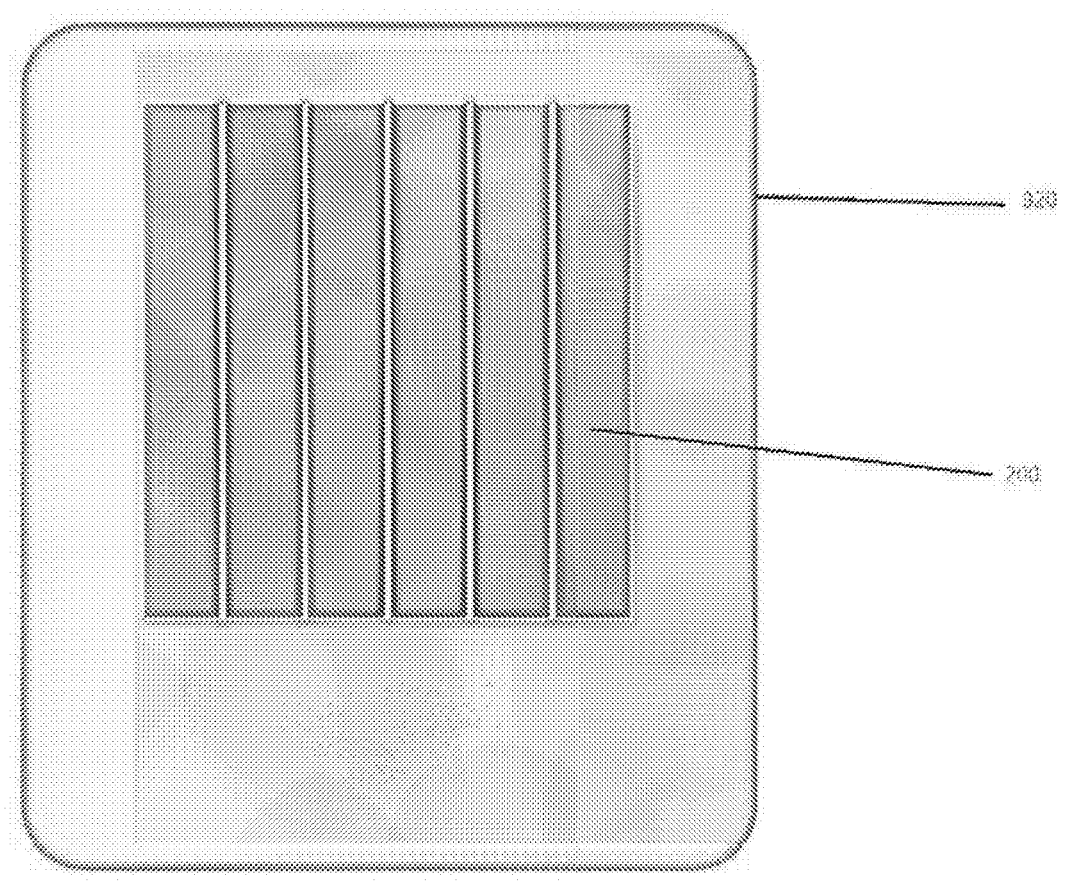

[Fig 5]
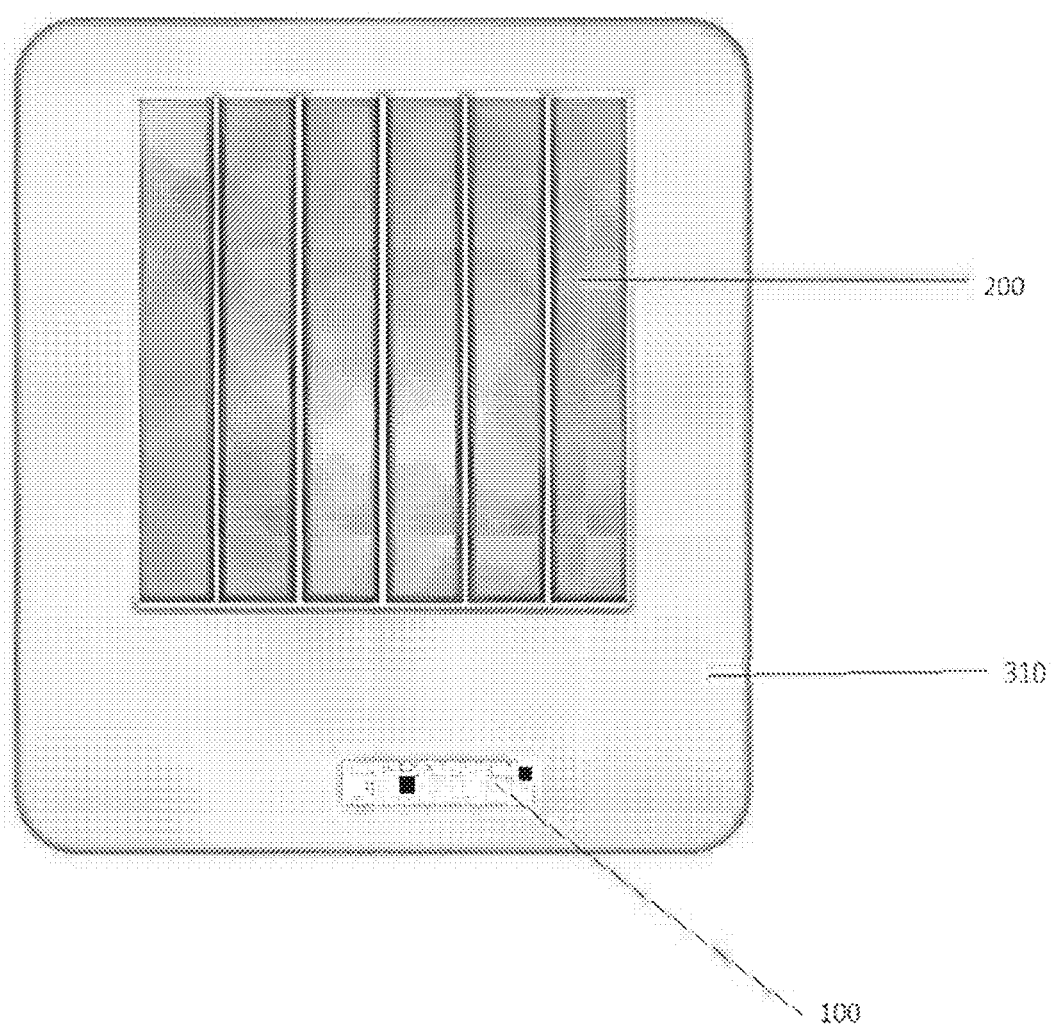
[Fig 6]
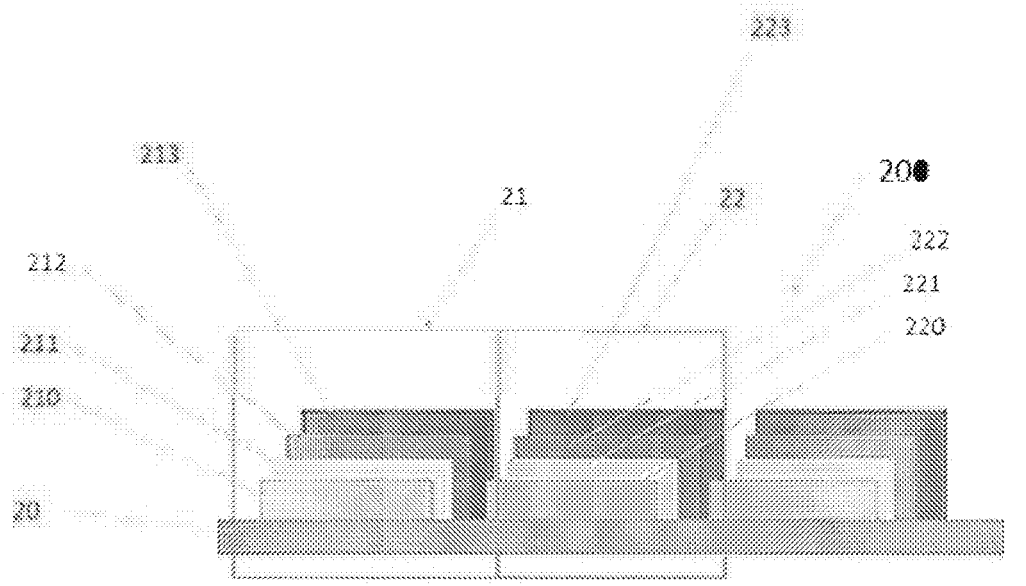

SELF-CONTAINED PHYSICAL DATA SENSOR OPERATING BY THE ENERGY INPUT FROM A PHOTOVOLTAIC MODULE

CROSS-REFERENCE TO RELATED APPLICATIONS

The present application is a filing under 35 u.s.c. 371 as the National Stage of International Application No. PCT/FR2022/050250, filed Feb. 11, 2022, entitled "SELF-CONTAINED PHYSICAL DATA SENSOR OPERATING BY THE ENERGY INPUT FROM A PHOTOVOLTAIC MODULE," which claims priority to French Application No. 2101316 filed with the Intellectual Property Office of France on Feb. 11, 2021 and French Application No. 2106419 filed with the Intellectual Property Office of France on Jun. 17, 2021, all of which are incorporated herein by reference in their entirety for all purposes.

The present invention relates to a physical data sensor. More particularly, the invention relates to a sensor that is self-contained in terms of energy and that runs on the energy supplied by a photovoltaic module.

The physical data sensors currently used are generally basic low-cost temperature indicators associated with batteries to be supplied with power. The sensors are therefore generally in the form of a three-dimensional object, for example in the form of a box, having non-negligible dimensions, in particular a thickness generally greater than 3 cm.

However, in the current state of the art, there are no physical sensors with a long lifetime, that is a lifetime greater than five years. Indeed, it is generally necessary to handle the sensor less than once every five years so as to replace or modify the battery.

One of the aims of the invention is to remedy the insufficiencies of the sensors currently known.

According to a first aspect, the invention relates to a physical data sensor comprising:

- a photovoltaic module comprising at least two photovoltaic cells interconnected in series,
- an electronic device configured to collect and transmit at least temperature data, the electronic device comprising a flexible printed circuit,
- electrical connector means connecting the photovoltaic module and the electronic device, the photovoltaic module being disposed at least in part above an element comprising at least part of the electronic device, the sensor further comprising two electrically insulating plates; a first plate above which the electronic device is arranged and a second plate configured to allow light radiation to pass through so that the light radiation is received by at least part of said photovoltaic module, the sensor being characterized in that it has a thickness between 5 mm and 10 mm, and in that the photovoltaic module comprises:

- a flexible substrate made of a polymeric material,
- at least a first photovoltaic cell and a second photovoltaic cell disposed on the substrate, each of the two photovoltaic cells comprising:
  - i. an indium-tin oxide layer constituting the cathode and covering the substrate,
  - ii. a first interfacial layer of zinc oxide or aluminum-doped zinc oxide, the first interfacial layer covering the cathode,
  - iii. a photovoltaic active layer covering the first interfacial layer, and

- iv. a second interfacial layer comprising a polymer blend of poly(3,4-ethylenedioxythiophene) and sodium poly(styrene sulfonate), the second interfacial layer constituting the anode and covering the photovoltaic active layer, the second interfacial layer being continuous, having an organic fibrous structure and an average thickness of between 100 nm and 400 nm, the second interfacial layer of the first photovoltaic cell being in contact with the indium-tin oxide layer of the second photovoltaic cell.

For the purposes of the present application, a flexible printed circuit is understood to mean a flexible circuit laminated between two insulating plates. The presence of such a printed circuit allows the sensor to conform to the environment in which it can be integrated so as to facilitate and increase the possibilities of integrating the sensor into various products.

According to this first aspect, the sensor only consumes very little energy and is configured to transform the light energy to which it is exposed into electrical energy that it needs to collect the physical data. The electrical energy which the electronic device needs to operate is generated by the photovoltaic module which, following the reception of the light radiation, generates a photocurrent sufficient to ensure proper operation of the electronic device. This light radiation passes through at least the second plate and/or passes through an opening made in this second plate before being received by the photovoltaic module.

In particular, the photovoltaic module in question according to this first aspect has the advantage of being able to be used effectively under indoor radiation, that is to say a radiation lower than 1000 lux, possibly lower than 500 lux. In particular, with such a photovoltaic module, the photo-generated charge losses are minimized, and their transfers between the different layers of the organic photovoltaic cells are improved so as to have an overall stability of the photovoltaic module. Indeed, with such a photovoltaic module, an additional layer applied to the second interfacial layer is avoided. There is therefore one layer which is both the second interfacial layer and the anode layer. In this case, organic photovoltaic cells are therefore used comprising less interfaces than in those used in the current state of the art. Therefore, the risk of losing photo-generated charges is reduced and the risk of having interface oxidation is also reduced.

Moreover, using a photovoltaic module rather than a battery also makes it possible to reduce the maintenance of the sensors, in particular by eliminating the replacement of batteries, and therefore of facilitating their use and significantly reducing, inter alia, the time and the cost of handling incurred, for example, by replacing a battery. Also, using a photovoltaic module rather than a battery makes it possible to increase the lifetime of the sensor.

Also, eliminating the use of a battery to be integrated into the sensor makes it possible to make sensors with new designs that are even more integrated into their environment, in particular thanks to its thickness which is less than 10 mm. It is thus possible to develop self-contained sensors integrated into small spaces.

However, it should be noted that a storage element can be integrated into the sensor. For example, such storage elements include but are not limited to capacitors, supercapacitors and even micro-batteries.

Furthermore, using and producing this sensor with flexible materials and substrates simplify its use in many cases.

It should also be noted that the flexible substrate may be made of polyethylene.

Furthermore, preferably, the substrate may be transparent. Thus, the substrate can be passed through by light radiation so that the constituent layers of the photovoltaic module applied to one face of the substrate can generate the electrical energy necessary for the correct operation of the electronic device when the light radiation is received by the other face of the substrate.

In a particular embodiment, it is advantageous to communicate precise temperature readings over a predefined duration, in particular taking into account the frequency at which the sensor was subjected to these different temperatures. Therefore, in this embodiment, the electronic device is configured to store the temperature data as a function of time.

According to one particular embodiment, it is advantageous for the module to be able to use the ambient light energy even if it is lower than 1000 lux, possibly lower than 500 lux. In this case, the second interfacial layers have a sheet resistance between $100\Omega/\square$ and $600\Omega/\square$.

According to one particular embodiment, it is preferable for the sensor to be able to collect a large amount of data relating to the environment in which it is located. In this embodiment, the electronic device further comprises an accelerometer and the electronic device is preferably further configured to collect moisture data. Moreover, this sensor can also make it possible to collect more physical data such as environmental data relating to a human presence, a pressure, or even a change in light.

According to one particular embodiment, it is also preferable that the transmission of the collected information can be done effectively, that is to say quickly, without loss of data and in a secure manner. In this embodiment, the electronic device further comprises a telecommunication means configured to transmit the collected data to an external device according to a telecommunication protocol. For example, this telecommunication protocol may be chosen from among the Bluetooth Low Energy protocol (or BLE for short), the radio telecommunication protocol LoRaWan, the SIGFOX protocol or the ZIGBEE protocol.

Preferably, the first plate may further be configured to allow light radiation to pass through. Thus, the light radiation can be received by either of the faces of the photovoltaic module, which makes it possible to guarantee the generation of energy by overcoming the orientation of the sensor. Thus, even with light radiation received by the photovoltaic module with angle of incidence approximately equal to 90°, it is possible to generate 15% of the maximum power obtained with an angle of incidence approximately equal to 0°.

Therefore, the two electrically insulating plates may for example be transparent plastic or plasticized plates to allow light radiation to pass through so that the light radiation is at least partially received by the photovoltaic module. For example, the plates may have been laminated to give them transparency properties. Also, the first and/or second plates may comprise an opening through which the light radiation passes so as to be received by at least part of the photovoltaic module. In this way, the power delivered by the photovoltaic module is increased relative to a photovoltaic module comprising only the second which is configured to allow light radiation to pass and having an active surface of the module identical and exposed to the same luminosity. In this configuration, the efficiency of the sensor is improved. Thus, the frequency of data transmission via a telecommunication means, availability, communication coverage and network detection of the sensor according to this configuration are all increased relative to a photovoltaic module comprising only the second one which is configured to allow light radiation to pass through. Also, the communication distance is greater under this configuration, the sensor becomes more precise with, for example, an increase in the number of acquisition and the standby currents have better compensation and the recharging of the associated storage element is faster. Consequently, the sensor becomes more reliable in this configuration.

In particular, in the case where there is a sensor having two electrically insulating plates configured to allow light radiation to pass through, a configuration wherein only the first transparent electrode (anode or cathode) is exposed to direct light, a few photons are also indirectly received by the second electrode (cathode or anode respectively). This indirect illumination makes it possible to improve the performance of the photovoltaic module by 3%.

It should also be noted that, in cases where the first electrically insulating plate, that is to say that placed on the side of the indium-tin oxide layer, is not configured to allow light radiation to pass through, and where only the second electrically insulating plate, that is, the one placed on the side of the layer comprising a polymer mixture of poly (3,4-ethylenedioxythiophene) and sodium poly(styrene sulfonate) makes it possible to allow light radiation to pass through and therefore to collect energy, the photovoltaic module still makes it possible to ensure 65% of total performance.

It should also be noted that in the case where there is a sensor having two electrically insulating plates configured to allow light radiation to pass through, a configuration wherein the anode and the cathode are both exposed to direct lighting, the performance of the photovoltaic module can be doubled relative to the configuration in which only the first transparent electrode (anode or cathode) is exposed to direct lighting.

Furthermore, these plates can encapsulate the assembly comprising the electronic device, the photovoltaic module and the connector means so as to isolate this assembly from the outside in order to obtain a sensor that is moisture-tight for example. In this case, at the periphery of this assembly, the two plates are directly in contact so as to hermetically insulate the electronic device and the connector means from the exterior, while guaranteeing the reception of light radiation coming from the outside of the photovoltaic module via for example the opening made in the second plate, or by the use of a transparent plate.

It should also be noted that the photovoltaic module can be produced by an inkjet printing method.

It should also be noted that within the meaning of the present invention, the terms above and below are understood to mean either directly or indirectly above or below. Thus, if a first element is considered to be above a second element, there may be a third element between this first and this second element.

The invention will be better understood on reading the following description, which is provided solely by way of example, and with reference to the appended figures in which:

FIG. 1 represents a first exploded view before assembling a sensor according to a first preferred embodiment of the invention;

FIG. 2 represents a second exploded view before assembling a sensor according to the first preferred embodiment of the invention;

FIG. 3 represents an exploded view before assembling a sensor according to a second preferred embodiment of the invention;

FIG. 4 represents a first view (front view) after assembling a sensor according to the second preferred embodiment of the invention, FIG. 5 represents a second view (rear view) after assembling a sensor according to the second preferred embodiment of the invention, and FIG. 6 represents a scheme of the construction of a photovoltaic module used according to a preferred embodiment of the invention The sensor shown in FIGS. 1 and 2 is composed of an organic photovoltaic module 200 comprising:

a flexible and transparent substrate made of polyethylene terephthalate (commonly denoted by the acronym PET) or of polyethylene (poly(ethylene) 2,6-naphthalate (commonly denoted by the acronym PEN)), ten photovoltaic cells interconnected in series and arranged on the substrate.

Each of the photovoltaic cells comprises:

i. an indium-tin oxide layer constituting the cathode and covering the substrate, ii. a first interfacial layer of zinc oxide or aluminum-doped zinc oxide, the first interfacial layer covering the cathode, iii. a photovoltaic active layer covering said first interfacial layer, and iv. a second interfacial layer comprising a polymer blend of poly(3,4-ethylenedioxythiophene) and sodium poly (styrene sulfonate), said second interfacial layer constituting the anode and covering said photovoltaic active layer, said second interfacial layer being continuous, having an organic fibrous structure and an average thickness of between 100 nm and 400 nm.

It should be noted that the second interfacial layer of a photovoltaic cell chosen from among the ten photovoltaic cells cited above is in contact with the indium-tin oxide layer of one of the adjacent photovoltaic cells (see FIG. 6).

For the production of such a module, a fast, economical, stable and easily reproducible manufacturing method is implemented.

In particular, according to a preferred mode according to the invention, the photovoltaic module is produced as indicated below (see FIG. 6).

First, a substrate is provided 20 made of PET or PEN, for example, on which a discontinuous indium tin oxide layer 210, 220 is deposited. Each of the portions of indium tin oxide layers 210, 220 is the cathode of each of the photovoltaic cells of the photovoltaic module. In particular, there is therefore a substrate 20 made of PET coated with a indium-tin oxide layer 210, 220, discontinuous so that the substrate 20 is either partly covered with indium-tin oxide layers 210 and 220 which will form the cathodes of two different adjacent organic photovoltaic cells 21 and 22 described below. The substrate 20 may be cleaned, if needed, before application of the indium tin oxide layer by taking care to use a solvent compatible with the material of the substrate, in particular.

Next, inkjet printing is applied to the indium tin oxide layer 210, 220, a first ink composition comprising zinc oxide nanoparticles or aluminum-doped zinc oxide nanoparticles. In a first example, it is possible to have as the first ink composition an ink comprising laboratory-synthesized zinc oxide nanoparticles. In particular, the zinc oxide nanoparticles can be obtained by implementing the Polyol technique at the end of which the zinc oxide nanoparticles are cooled in a cold bath, then separated by centrifugation (12 min and 7800 rpm) before being dispersed in butanol using ethylene glycol as a surfactant. In another example, it is possible to have as the first ink composition an ink of laboratory-synthesized aluminum-doped zinc oxide (AZO) nanoparticles sold by GENES'INK. Once either of these first ink compositions has been applied to the indium tin oxide layer, a heat treatment is carried out at a temperature comprised between 70° C. and 130° C. for a period between 1 and 5 minutes, to form the first interfacial layer 211, 221. In particular, this heat treatment of the step is carried out on a hot plate at a temperature of 85° C. for 3 minutes. In particular, first interfacial layers are obtained 211 and 221 of photovoltaic cells 21 and 22 of the photovoltaic module 200 as shown in FIG. 6.

Next, inkjet printing is used to deposit on the first interfacial layer 211 and 221 a second ink composition comprising a mixture of polymers comprising [6,6]-phenyl-$C_{61}$-methyl butanoate associated with poly(thienol [3,4-b]-thiophene) to form the active layer 212 and 222. For example, this ink can be composed of a first polymer mixture of [6,6]-phenyl-$C_{7i}$-methyl butanoate sold by Nano-C® under the trade name PC70BM, and poly(thienol [3,4-b]-thiophene sold by Raynergy Tek® under the trade name PV2000 or a second polymer mixture of [6,6]-phenyl-$C_{71}$-methyl butanoate sold by Nano-C® under the trade name PC70BM and poly(thienol [3,4-b]-thiophene sold by 1-Materials under the trade name PTB7-Th. Each of these two polymer mixtures is associated with O-xylene as a solvent (ortho-xylene with formula $C_6H_4(CH_3)_2$), and tetralin (1,2,3,4-tetrahydronaphthalene) as an additive to form the photovoltaic active layers 212 and 222. In particular, the polymer PV 2000 of the first mixture or polymer PTB7-Th of the second mixture are preferably present in these second ink compositions at the rate of 10 mg/mL. Furthermore, the mass ratio between the polymer PV 2000 of the first mixture or polymer PTB7-Th of the second mixture and PC70BM is preferably 1:1.5. Also, it should be noted that, preferably, the volume ratio between the solvent O-xylene and the additive tetralin is 97:3 in these two compositions. It should be noted that the two ink compositions are made by adding to the first and to the second polymer mixtures the solvent and the additive, while maintaining them for about approximately 24 hours under stirring on an 80° C. heating plate at a speed of 700 RPM. One or the other of these two compositions is then applied to form the active layer 212 and 222. Also, in this preferred embodiment, to further reduce the series resistances between each of the layers of the organic photovoltaic cells, after applying the active layer, the photovoltaic active layers are cleaned using a solvent chosen from ethanol, butanol, methanol, isopropanol and ethylene glycol. Next, a heat treatment is carried out at a temperature comprised between 70° C. and 130° C. for a period between 1 and 5 minutes, to form the active layer. In particular, this heat treatment is carried out on a hot plate at a temperature of 85° C. for 2 minutes.

Then, in a subsequent step, inkjet printing is used to deposit on the photovoltaic active layer 212, 222, of the photovoltaic cell 21, 22 in manufacturing, a third ink composition comprising a polymer blend of poly (3,4-ethylenedioxythiophene) and sodium poly (styrene sulfonate) which will also be in contact with the indium tin oxide layer of an adjacent photovoltaic cell. The application of this third ink composition will form the second interfacial layer 213 and 223 of the photovoltaic cells 21 and 22 of the photovoltaic module 200. This third interfacial layer may for example comprise:

7 | 8

PEDOT:PSS marketed by Agfa® under the trade name IJ 1005 or PEDOT:PSS marketed by Agfa® under the trade name ORGACON S315, Triton X-100 (4-(1,1,3,3-tetramethylbutyl)phenyl-polyethylene glycol with formula Oct-$C_6H_4$—$(OCH_2CH_2)_xOH$, x=9-10) marketed by Merck® as a detergent/surfactant;

Ethanediol (or ethylene glycol, with formula $HOCH_2CH_2OH$) marketed by Merck®;

glycerol (1,2,3-Propanetriol or glycerin, with formula $HOCH_2CH(OH)CH_2OH$) marketed by Merck®; and deionized water, produced in the laboratory or marketed by the company PURELAB® classic under the brand name ELGA® for water.

Next, a heat treatment is carried out at a temperature comprised between 70° C. and 130° C. for a period between 1 and 5 minutes, to form the second interfacial layer 213, 223 which is also the anode. In particular, this heat treatment is carried out on a hot plate at a temperature of 120° C. for 1 to 5 minutes.

The photovoltaic module 200 thus obtained is flexible and the second interfacial layers 213, 223 have a sheet resistance between 100Ω/□ and 600Ω/□.

By proceeding in this way, the organic photovoltaic module 200 obtained has a conversion efficiency between 14% and 23%, which is sufficient to be able to use the photovoltaic module 200 effectively in indoor radiation, that is, radiation less than 1000 lux, possibly lower than 500 lux. In particular, with this organic photovoltaic module 200, the photo-generated charge losses are minimized, and their transfers between the different layers of the organic photovoltaic cells are improved so as to have an overall stability of the photovoltaic module. Indeed, the general stability of an organic photovoltaic module 200 depends on the intrinsic stability of the different layers constituting each of the organic photovoltaic cells of the organic photovoltaic module but also on the stability of the interfaces between each of these layers. In addition, with the photovoltaic module 200 used in this preferred embodiment, an additional layer applied to the second interfacial layer is eliminated. There is therefore one layer which is both the second interfacial layer and the anode layer. In this case, organic photovoltaic cells are therefore used comprising less interfaces than in those used in the current state of the art. Therefore, the risk of losing photo-generated charges is reduced and the risk of having interface oxidation is also reduced.

It is therefore not necessary, for manufacturing this photovoltaic module, to carry out a heat treatment above 130° C., a heat treatment which is currently implemented in the state of the art to generally anneal the anode layer generally applied to the second interfacial layer which may be made of silver, or made of materials having similar properties used as anodes in organic photovoltaic cells with a reverse structure, in particular. The advantage of not using such a heat treatment is that the other layers of the organic photovoltaic cells are not affected by the high temperature. For example, photovoltaic modules can be used that include substrates with glass transition temperatures below 130° C., such as polyethylene, for instance.

The photovoltaic module 200 is connected to an electronic device 100 via electrical connector means 120. For example, these connector means 120 may be two AWG cable type connectors.

The electronic device 100 comprises in particular electronic components configured for the electronic device 100 or configured to collect and transmit at least temperature data and, preferably configured to store these temperature data as a function of time. Also, the electronic device 100 further comprises an accelerometer and is preferably furthermore configured to collect moisture data.

The electronic device 100 further comprises a telecommunication means configured to transmit the collected data to an external device according to a telecommunication protocol known to a person skilled in the art.

Next, the photovoltaic module 200 is placed above the electronic device 100 as shown in FIGS. 1 and 2.

According to a first preferred embodiment and as shown in FIGS. 1 and 2, the assembly comprising the photovoltaic module 200, the electronic device 100 and the connector means 120 is lastly encapsulated between two electrically insulating plates 310, 320: a first plate 310 above which the electronic device 100 is placed and a second plate 320 which is placed above the photovoltaic module 200 which is itself placed between the first plate 310 and the second plate 320. Here, these two plates are transparent and in the form of PET barrier films which have the objective of making the sensor tight so as to avoid introducing oxygen and moisture molecules into the sensor. These two plates are placed by lamination for 10 minutes at a temperature below 85° C. with a deposit of glue. This step, which is considered a step of encapsulation, gives the sensor high resistance over time as well as good resistance to moisture. It should be noted that the second plate 320, that is, the film arranged on the side of the photovoltaic module 200, may, but not necessarily to the extent that the second plate 320 is transparent, comprise an opening 322 through which the photovoltaic module 200 is at least partly arranged.

According to a second preferred embodiment and as shown in FIGS. 3 and 5, the assembly comprising the photovoltaic module 200, the electronic device 100 and the connector means 120 is lastly encapsulated between two electrically insulating plates 310, 320: a first plate 310 above which the electronic device 100 is placed and a second plate 320 which is placed above the photovoltaic module 200 which is itself placed between the first plate 310 and the second plate 320. Here, the configuration is similar to that of the first embodiment. However, in this second embodiment, these two plates are either partially transparent so that at least part of the photovoltaic module 200 can receive the light radiation, or both comprise an opening 322 through which the photovoltaic module 200 adapted to directly or indirectly receive the light radiation, that is, the light radiation passes through the transparent substrate and is then received by the photovoltaic module 200.

Furthermore, electronic components of the electronic device 100 are visible through the first plate 310 for example, but could very well be visible through the second plate 320. These components are in particular encapsulated between the two plates 310 and 320.

The sensor thus obtained according to the invention, and in particular according to these two preferred embodiments, may have a thickness from 5 mm to 10 mm depending on the thicknesses of the electronic device 100, of the photovoltaic module 200, and of each of the two plates 310 and 320.

The invention claimed is:

1. A physical data sensor comprising:
a photovoltaic module comprising at least two photovoltaic cells interconnected in series,
an electronic device configured to collect and transmit at least temperature data, the electronic device comprising a flexible printed circuit,
an electrical connector connecting the photovoltaic module and the electronic device, the photovoltaic module being disposed at least in part above an element comprising at least part of the electronic device, the sensor further comprising two electrically insulating plates: a first plate above which the electronic device is arranged and a second plate configured to allow light radiation to pass through so that the light radiation is received by at least part of said photovoltaic module, the sensor being characterized in that it has a thickness between 5 mm and 10 mm, and in that the photovoltaic module comprises:

a flexible substrate made of a polymeric material, a first photovoltaic cell and a second photovoltaic cell disposed on the substrate, each of the first and second photovoltaic cells comprising:

i. an indium-tin oxide layer constituting a cathode and covering the substrate, ii. a first interfacial layer of zinc oxide or aluminum-doped zinc oxide, the first interfacial layer covering the cathode, iii. a photovoltaic active layer covering the first interfacial layer, and iv. a second interfacial layer comprising a polymer blend of poly (3,4-ethylenedioxythiophene) and sodium poly(styrene sulfonate), the second interfacial layer constituting an anode and covering the photovoltaic active layer, the second interfacial layer being the outermost layer of the photovoltaic cell, the second interfacial layer being continuous, having an organic fibrous structure and an average thickness of between 100 nm and 400 nm, the second interfacial layer of the first photovoltaic cell being in direct contact with the indium-tin oxide layer of the second photovoltaic cell.

2. The sensor according to claim 1, wherein the electronic device is configured to store the temperature data as a function of time.

3. The sensor according to claim 1, according to which the second interfacial layers have a sheet resistance between $100\Omega/\square$ and $600\Omega/\square$.

4. The sensor according to claim 1, according to which the electronic device further comprises an accelerometer.

5. The sensor according to claim 1, wherein the electronic device further comprises a telecommunication element configured to transmit the collected data to an external element according to a telecommunication protocol.

6. The sensor according to claim 1, wherein the second plate comprises an opening through which the light radiation passes so as to be received at least in part by the photovoltaic module.

7. The sensor according to claim 1, wherein the first plate is further configured to allow light radiation to pass through.

8. The sensor according to claim 1, wherein the substrate is transparent.

9. The sensor according to claim 1, wherein the electronic device is further configured to collect moisture data.

\* \* \* \* \*